May 7, 1968 I. G. AKMENKALNS 3,382,378

CLAMP CIRCUIT

Filed April 27, 1964

INVENTOR
IVARS G. AKMENKALNS

BY Ronald J. Clark

ATTORNEY 3,382,378

CLAMP CIRCUIT

Ivars G. Akmenkalns, Endicott, N.Y., assignor to International Business Machines Corporation, New York, N.Y., a corporation of New York Filed Apr. 27, 1964, Ser. No. 362,716
4 Claims. (Cl. 307—237)

ABSTRACT OF THE DISCLOSURE

A low level clamping circuit comprising a transistor operating as a diode. More specifically, a transistor is connected in a grounded emitter configuration and is equipped with a load resistor and voltage supply for determining its entry point into the saturated condition and a base lead for applying the signal to the transistor. The ohmic value of the load resistor and the collector voltage supply specifies the point on the transistor characteristic curve at which the transistor saturates. The saturation point specifies the rectifying level because the transistor enters saturation at the input voltage level that is selected as the clamping level. The instant invention creates a low level clamp circuit which begins operation with a few micro-amps of base-emitter current.

This invention relates to clamping circuits and more particularly, to a low current level transistor clamping circuit.

An ideal diode clamp operates to maintain a constant voltage for all forward currents. A practical semiconductor diode can, however, only approximate this characteristic. A convenient means for determining the quality of a diode as a clamp consists of measuring the voltage change across the diode for each corresponding unit change of current through the diode. It is a well-known fact that this property for a semiconductor can be stated in the following manner:

$$r=\frac{dV}{dI}=\frac{kT}{gI}$$

where $r$ is the diode A-C resistance
$k$ is Boltzman's constant
T is temperature of the device
$g$ is electronic charge
V is voltage across diode
I is diode current At room temperature of $T=300°$ K., it can be shown that $$r=\frac{0.025}{I}\text{ ohm}$$

where

I is in amperes.

From this it is clear that the diode clamping properties depend on the current through the diode. For an example, a diode resistance of one ohm can only be obtained if a current of 25 milliamps is supplied to the diode. Good clamping action of semiconductor diodes can therefore be obtained only by providing relatively high currents through the diode.

A second important property of good clamp diode is a low voltage drop across the diode at the clamping current levels. This low voltage drop will result in low power losses in the diode. In rectifier circuits the voltage drop across the diode will determine the minimum rectifiable signal and again a low diode voltage drop is desirable.

These problems have been recognized and attempts have been made to correct it, but only a partially satisfactory solution has hitherto been suggested. U.S. Patent 2,980,806 to D. L. Ort describes a method of utilizing a transistor in the common base configuration as a low voltage diode. Additionally, U.S. Patent 3,012,153 to M. E. Mussard describes a method of avoiding the effects of the internal impedance of a diode at various reference levels and the consequent sharpening of the knee of the diode characteristic curve.

It is an object of the instant invention to provide an improved clamping circuit which operates to establish current clamping levels.

It is an additional object of the instant invention to provide an improved clamping circuit which operates to establish very low current clamping levels.

It is another object of the instant invention to provide an improved low power clamping circuit having a minimum number of components.

It is a further object of the instant invention to provide an improved clamping circuit suitable for operation with input signals having small current changes.

It is a still further object of the instant invention to provide a transistor clamp circuit which operates in the grounded emitter configuration.

It is an additional object of the instant invention to provide a transistor clamp circuit which operates in the saturated condition.

It is a further object of the instant invention to provide a transistor clamp circuit which operates at a plurality of clipping levels.

According to these objects, the system embodying the invention comprises a transistor operating as a diode. More specifically, a transistor is connected in a grounded emitter configuration and is equipped with a load resistor and voltage supply for determining its entry point into the saturated condition and a base lead for applying the signal to the transistor. The ohmic value of the load resistor and the collector voltage supply specifies the point on the transistor characteristic curve at which the transistor saturates. The saturation point specifies the rectifying level because the transistor enters saturation at the input voltage level that is selected as the clamping level. The instant invention creates a low level clamp circuit which begins operation with a few micro-amps of base-emitter current and continues to exceed the operating characteristic of diodes at an input current level of several milli-amps.

The foregoing and other objects, features and advantages of the invention will be apparent from the following more particular description of preferred embodiments of the invention, as illustrated in the accompanying drawings; wherein:

FIG. 1*a* is a schematic diagram of a diode having an input signal applied thereto;

FIG. 1*b* is a representative characteristic curve of the diode shown in FIG. 1*a*;

FIG. 2*a* is a schematic diagram of one embodiment of the instant invention;

FIG. 2*b* is a representative characteristic curve of the circuit shown in FIG. 2*a*;

The same number representing the same element will be used throughout the several figures.

Figure 1A:
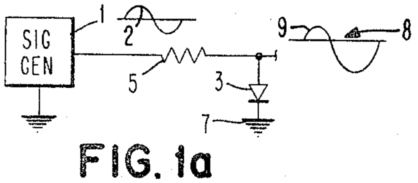
FIG. 1a PRIOR ART

FIG. 1 shows a signal generator 1 applying an input signal 2 to a semiconductor diode 3 by a resistor 5. The diode is connected directly to ground 7 or other desired clamping potential. The output waveform 8 developed across the diode 3 exaggerates the positive portion of the resulting waveform, but this portion of the waveform demonstrates the physical operating limits of a diode. In general, the diode clamps the signal to ground by shunting the positive portion of the signal to ground. However, a positive signal 9 is passed by the diode due to the diode voltage drop.

Figure 1B:
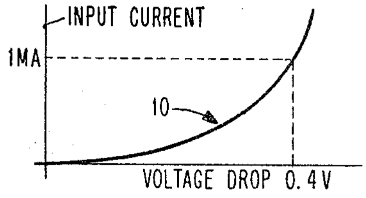

A representative characteristic operating curve 10 of the diode 3 is shown in FIG. 1*b*. This FIG. 1*b* shows the problems associated with semiconductor diodes as used on FIG. 1*a*. The diode voltage is always changing for a changing current through the diode and a considerable voltage drop appears across the diode. The current and voltage values are typical of a germanium diode.

Figure 2A:
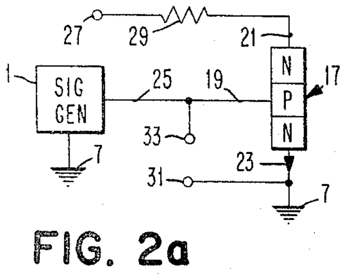

A schematic diagram of the instant invention is shown in FIG. 2*a* and it includes the signal generator 1 and a transistor 17 having a base lead 19, a collector lead 21 and an emitter lead 23. A suitable transistor is that identified as an NPN transistor number, 2N1308 manufactured by the Texas Instrument Co. A PNP transistor, having opposite reference potential polarities, would operate as well as the hereinafter described NPN transistor 17. A signal lead 25 connects the generator 1 to the base lead 19 of the transistor 17. The collector lead 21 is connected to a source of positive potential 27 by a load resistor 29. A suitable potential source 27 may be at a level of a positive 6 volts. This potential source may be as low as 1 volt. The emitter lead 23 is connected to ground 7 and to a first output terminal 31. A second output terminal 33 is connected to the junction of the base lead 19 and the signal lead 25.

Figure 2B:
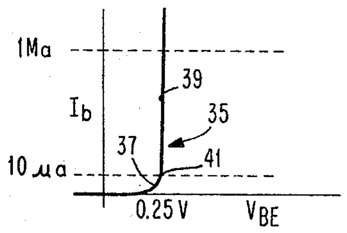

FIG. 2*b* shows the base-emitter characteristic curve 35 of the circuit shown in FIG. 2*a*. The curve 35 comprises exponential portion 37, a saturated portion 39 and a knee 41. However, FIG. 2*b* demonstrates the improvements and advantages of the instant invention over the prior art. A low level input signal of 10 micro-amps causes the transistor to become saturated with an attendant voltage drop of 0.25 volt. The transistor performs its clamping function in the saturated condition with low power being dissipated therein. Additionally, driving the transistor into its saturated condition causes an instantaneous impedance change as opposed to the relatively slow impedance change of the diode as the current value of the diode's input signal increases towards the 1 milliamp level. It is only after the input signal exceeds the several milli-amps level that the diode shows an impedance small enough to be comparable to one obtained by a clamping circuit constructed according to the instant invention.

Figure 3:
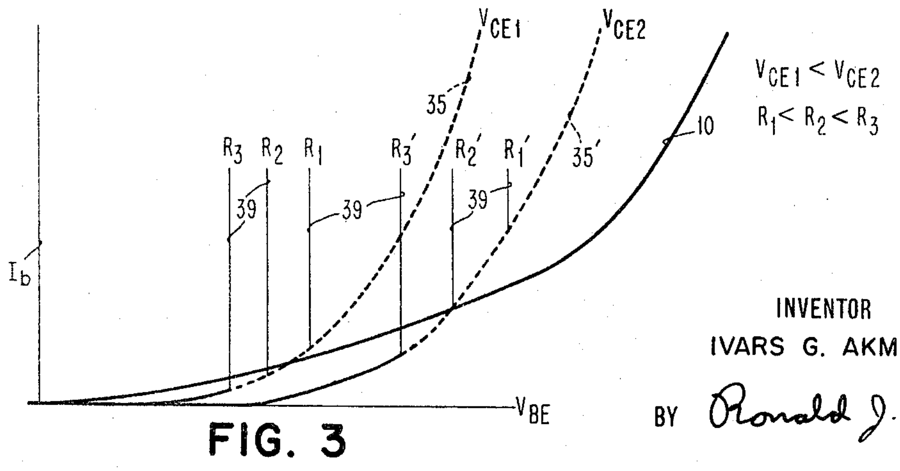
FIG. 3 is a graphical view showing the versatility of the instant invention is operating at a plurality of different clipping levels.

Referring to FIG. 3 there can be seen a plurality of characteristic curves which show the advantages of the instant invention over a diode. The representative characteristic curve 10 of a diode is shown with a plurality of characteristic curves of the instant invention. The curve 35 is associated with the potential source 27 shown in FIG. 2*a* and the curve 35' is associated with a potential source of greater value such as a voltage level of 12 volts.

Additionally, a plurality of saturation lines 39 are associated with each curve 35 and 35'. Each of the lines 39 are labeled with the relative values of the load resistor 29 needed to place the transistor into saturation. An inspection of FIG. 3 shows that the combination of a load resistor 29 and a potential source 27 are combined to select a current value at which the transistor saturates. The use of the instant invention need not be confined to operate with low level input signals, but can be employed to operate with higher level input signals which do not exceed the power handling capacity of the selected transistor.

Figure 4:
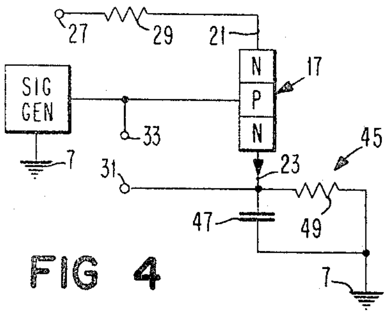
FIG. 4 is a schematic diagram of the instant invention connected as a series rectifier.
Figure 5:
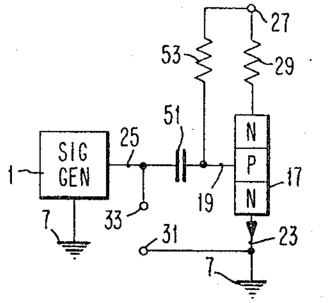
FIG. 5 is a schematic view of the instant invention connected as a shunt rectifier.

FIG. 4 and FIG. 5 show additional embodiments of the instant invention. FIG. 4 includes an additional series circuit 45 connected between the emitter lead 23 of the transistor 17 and ground 7. This circuit includes a parallel connection of a capacitor 47 and a resistor 49 and operates as the well-known series rectifier. For this circuit to operate properly, the signal voltage has to be small as compared with voltage 27.

FIG. 5 includes an additional input capacitor 51 connected between the signal line 25 and the base lead 19 and a resistor 53 connected between the junction of the capacitor 51 and the base lead 19 and the potential source 27. This circuit operates as the well-known shunt rectifier.

While the invention has been particularly shown and described with reference to preferred embodiments thereof, it will be understood by those skilled in the art that the foregoing and other changes in form and details may be made therein without departing from the spirit and scope of the invention.

What is claimed is:

1. In combination with a signal line, a low current level clamping circuit having a low incremental resistance, comprising:
- a transistor having base, emitter and collector electrodes;
- means for connecting said base electrode to said line;
- means for connecting said emitter electrode to a source of reference potential having a value substantially equal to the desired clamp potential;
- a resistor connecting said collector electrode to a source of operating potential for biasing said transistor into saturation at a desired low base to emitter potential difference;
- said transistor operating with a base current exceeding ten micro-amps and less than one milli-amp;
- an input terminal and a first output terminal connected to said base electrode; and
- a second output terminal connected to said emitter terminal whereby the output clamping signal is available at the base-to-emitter circuit.

2. In combination with a signal line, a low current level clamp, comprising:
- a transistor having base, emitter, and collector electrodes;
- said base electrode being connected directly to said line;
- said emitter electrode being connected to a reference level;
- a resistor connecting said collector electrode to a source of operating potential for selectably driving the transistor into saturation at the desired clamping level;
- said transistor operating at a maximum base current of less than one milli-amp;
- an input terminal and a first output terminal connected to said base electrode; and
- a second output terminal connected to said emitter terminal whereby the output clamping signal is available at the base-to-emitted circuit.

3. In combination with a signal line, a low current level clamp, comprising:
- a transistor having base, emitter and collector electrodes;
- a condenser connecting said base electrode to said line;
- said emitter electrode being connected to a source of potential;
- a resistor connecting said base electrode to said potential source;
- a resistor connecting said collector electrode to a source of operating potential for selectably driving the transistor into saturation at the desired clamping level;
- said transistor operating at a maximum base current of less than one milli-amp;
- an input terminal and a first output terminal connected to the electrode of said condenser to said line; and a second output terminal connected to said emitter terminal whereby the output clamping signal is available at the base-to-emitter circuit.

4. In combination with a signal line, a low current level clamp, comprising:

a transistor having base, emitter, and collector electrodes;

said base electrode being connected directly to said line;

a first resistor connecting said emitter electrode to a first source of potential;

a condenser connected in parallel with said first resistor;

a second resistor connecting said collector electrode to a second source of operating potential for selectably driving the transistor into saturation at the desired clamping level;

said transistor operating at a maxicum base current of less than one milli-amp;

an input terminal and a first output terminal connected to said base electrode; and a second output terminal connected to said emitter electrode whereby the output clamping signal is available in the base-to-emitter circuit.

References Cited

UNITED STATES PATENTS

| | | | |
|---|---|---|---|
| 2,873,387 | 2/1959 | Kidd | 307—88.5 |
| 3,147,407 | 9/1964 | Warner et al. | 307—88.5 X |
| 3,187,234 | 6/1965 | Muranaka et al. | 307—88.5 X |
| 3,259,843 | 7/1966 | Hurst | 307—88.5 X |
| 3,299,296 | 1/1967 | Bullene | 307—88.5 |

JOHN S. HEYMAN, *Primary Examiner.*